United States Patent [19]
Logue

[11] 3,984,860
[45] Oct. 5, 1976

[54] MULTI-FUNCTION LSI WAFERS

[75] Inventor: Joseph C. Logue, Poughkeepsie, N.Y.

[73] Assignee: International Business Machines Corporation, Armonk, N.Y.

[22] Filed: Dec. 13, 1974

[21] Appl. No.: 532,419

Related U.S. Application Data

[62] Division of Ser. No. 367,093, June 4, 1973, Pat. No. 3,879,839.

[52] U.S. Cl. .............................. 357/68; 29/57 A; 29/578; 357/70; 357/75
[51] Int. Cl.² ................. H01L 23/48; H01L 29/44; H01L 29/52; H01L 29/60
[58] Field of Search ............... 29/574, 578; 357/68, 357/75, 70

[56] References Cited
UNITED STATES PATENTS

| | | | |
|---|---|---|---|
| 3,707,655 | 12/1972 | Rudolph et al. .................. | 357/68 |
| 3,746,973 | 7/1973 | McMahon ............................ | 357/75 |
| 3,757,175 | 9/1973 | Kim et al. ........................... | 357/75 |
| 3,795,845 | 3/1974 | Cass et al. .......................... | 357/75 |
| 3,795,972 | 3/1974 | Calhoun ............................. | 29/578 |
| 3,795,974 | 3/1974 | Calhoun ............................. | 29/578 |

*Primary Examiner*—Andrew J. James
*Attorney, Agent, or Firm*—Edward S. Gershuny

[57] ABSTRACT

A system that is to be placed on a wafer is partitioned into reasonably large functions, each provided with a set of I/O and power pads. The wafer design is called "design A"0 A second wafer design (design B) that is the mirror image of design A is also constructed. Wafers of designs A and B are tested and divided into two groups: group I wafers have relatively few functions that are inoperative; group II wafers have relatively few functions that are operative. Inoperative functions are removed from group I wafers and discarded; good functions are removed from group II wafers and retained. A given function on wafer A is the mirror image of the same function on wafer B. Therefore, a given function from a group II wafer A (or B) can be inverted and attached to a group I wafer B (or A) that has had the corresponding function removed from it. The I/O and power pads of the function removed from the group II wafer are joined to the I/O and power pads remaining on the group I wafer.

4 Claims, 5 Drawing Figures

MULTI-FUNCTION LSI WAFERS

CROSS-REFERENCE TO RELATED APPLICATION

This is a division of Application Ser. No. 367,093 filed June 4, 1973, now U.S. Pat. No. 3,879,839, for Method of Manufacturing Multi-Function LSI Wafers, by J. C. Logue, assigned to International Business Machines Corp.

INTRODUCTION

This invention relates to solid state logic devices. More particularly, it concerns increasing the yield in the manufacture of multi-function LSI (large scale integration) wafers.

The advent of LSI manufacturing techniques has made it a common practice in many industries to produce semi-conductor wafers that are less than one inch square and which contain many thousands of circuits.

Increasing the number and density of circuits on a wafer also tends to increase production problems and to lower production yield. Of course, production yield is a significant factor affecting the net cost of useable wafers.

SUMMARY OF THE INVENTION

A system that is to be placed on a wafer is partitioned into reasonably large size functional islands so as to minimize the interconnections between functions. Each function is provided with a set of I/O and power pads which are interconnected in accordance with the system design. The above wafer design is called "design A". A second wafer design (design B) that is the mirror image of design A is also constructed. Wafers of designs A and B are produced and tested. The tested wafers are divided into two groups: group I wafers have relatively few functions that are inoperative; group II wafers have relatively few functions that are operative. A laser is used to cut out the bad functions from group I wafers. The cut is made inside the I/O and power pads. Similarly, a laser is used to cut out the good functions from group II wafers. This cut is made outside the I/O and power pads. The inoperative functions removed from group I wafers are discarded and the good functions removed from group II wafers are retained. Since wafer designs A and B are mirror images of each other, a given function on wafer A is also the mirror image of the same function on wafer B. Therefore, a given function from a group II wafer A (or B) can be inverted and attached to a group I wafer B (or A) that has had the corresponding function removed from it. The I/O and power pads of the function removed from the group II wafer are joined to the I/O and power pads remaining on the group I wafer. In this way, group I wafers are made useable or may undergo engineering changes.

The primary advantage of this invention is that it increases the yield of useable multi-function LSI wafers. Wafers which have only a small number of inoperative functional islands can be "repaired" and need not be discarded. Operative functional islands can be removed from wafers on which a large number of functions are inoperative, so that even these wafers need not be completely discarded.

Also, the invention provides a relatively simple and inexpensive means by which engineering changes may be made to LSI wafers.

The above and other features and advantages of the invention will be apparent from the following description of a peferred embodiment thereof as illustrated in the accompanying drawings.

DETAILED DESCRIPTION

Figure 1:
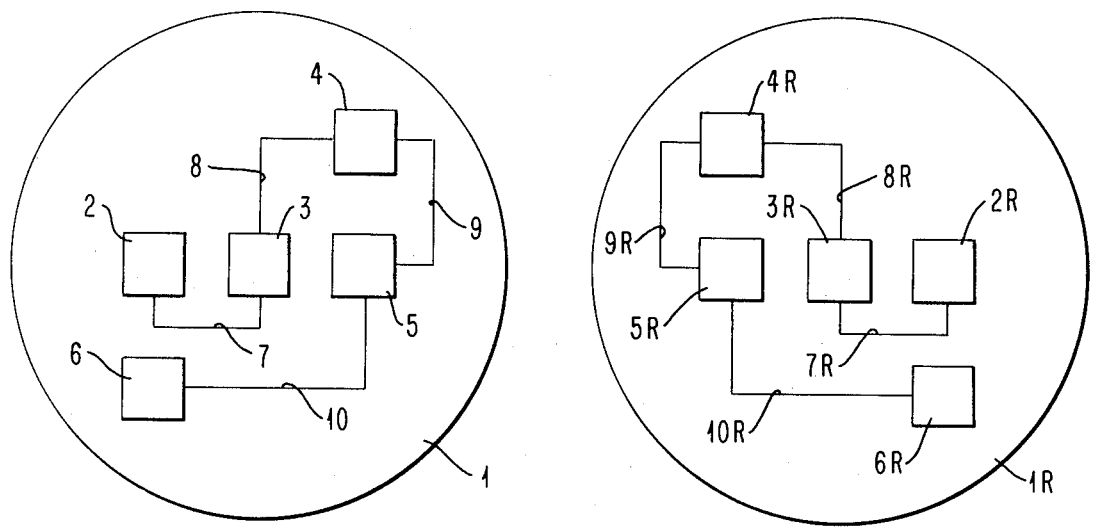
FIG. 1 shows two LSI wafers which are designed as mirror images of each other.

Throughout the specification and drawings there will be repeated references to wafers and/or wafer portions that are "mirror images" of each other. That is, these elements are identical to each other except that, as described herein, they are reversed from each other with respect to left and right directions. In order to more clearly illustrate this mirror image relationship, the first-mentioned one of a pair of elements which are mirror images of each other will be assigned a numerical reference character and the second-mentioned element of the mirror image pair will be assigned the same numerical reference character followed by the letter "R" (for "reversed").

The first step in the manufacturing process is to design a wafer. Preferably, the design will be such that a wafer is partitioned into reasonably large size functional islands with a minimum of interconnections between the islands. (Within the context of this specification, a functional island could be an active logic network or it could be a passive network comprising, for example, lines which interconnect other islands on the same or other wafers.) Each island is provided with a set of input-output (I/O) and power pads which are interconnected in accordance with the system design. This first design will hereinafter be referred to as "design A." A second wafer design (design B) that is the mirror image of design A is also constructed. The LSI wafers are then manufactured from the designs in any of various known manners.

Referring to FIG. 1, two wafers 1 and 1R are shown. Each wafer is the mirror image (with respect to left and right) of the other. Wafer 1 may be regarded as having been manufactured from design A; wafer 1R may be regarded as having been manufactured from design B. Wafer 1 contains functional islands 2, 3, 4, 5 and 6; wafer 1R contains functional islands 2R, 3R, 4R, 5R and 6R. In accordance with one aspect of the invention, it is preferred that each related pair of functional islands (2 and 2R, 3 and 3R, etc.) have the same mirror image relationship. However, in practicing this invenntion, it is only the mirror image relationship between the arrangement of I/O and power pads for any given pair of functional islands that is truly critical. If desired (for example, when making engineering changes) the LSI circuitry within a related pair of islands (for example, islands 4 and 4R) need not be exact mirror images of each other.

In FIG. 1, the interconnections between islands on wafers 1 and 1R are indicated by lines 7, 8, 9 and 10 and lines 7R, 8R, 9R and 10R, respectively. Although FIG. 1 shows a very simple network of interconnections between islands, it will be recognized that this is merely for purposes of illustration and that, on a real wafer, the interconnections will generally be somewhat more complex.

Figure 2:
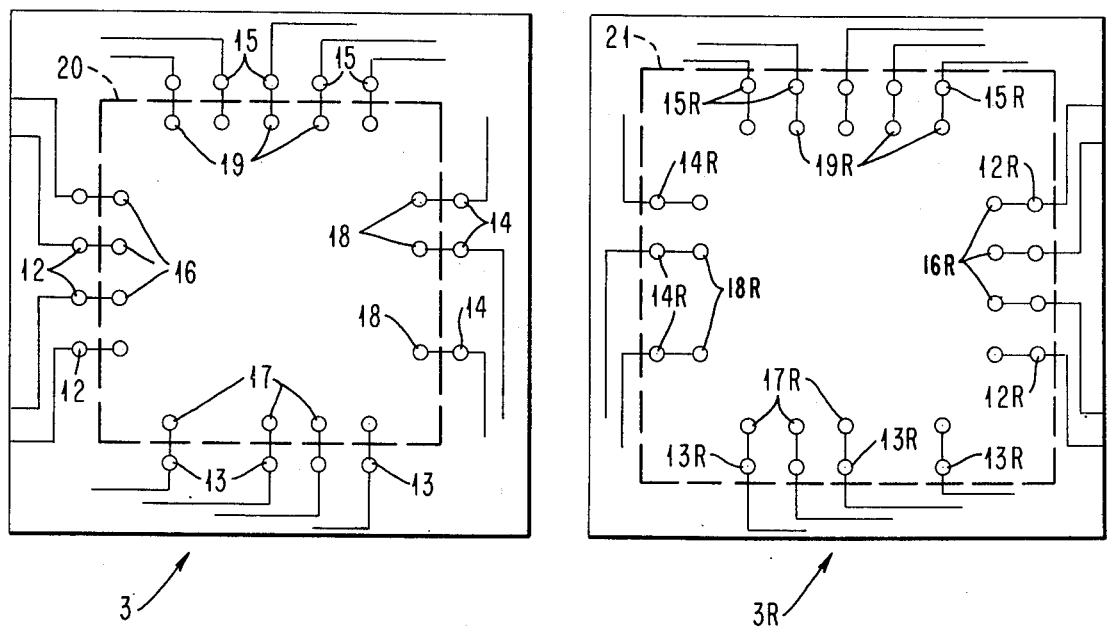
FIG. 2 shows additional details of one functional island from each of the wafers of FIG. 1.

FIG. 2 shows additional details of two exemplary functional islands 3 and 3R. Island 3 is provided with appropriate sets of I/O and power pads 12, 13, 14 and 15; island 3R is provided with a mirror image set of I/O and power pads 12R, 13R, 14R and 15R. Each of the islands 3 and 3R is preferably also provided with an additional set of inner power pads 16, 17, 18 and 19, and 16R, 17R, 18R and 19R, respectively. The inner power pads are not essential for practicing this invention, but are preferred for reasons which will be discussed below.

After the wafers are manufactured, they are tested and sorted into two different classes. Class I will contain those wafers for which most or all of the functional islands passed all of the test requirements. Class II will contain those wafers on which most, but not all, of the functional islands failed one or more of the tests (a functional island which has not passed all tests is referred to here as an inoperative island). Any wafer on which all of the functional islands were found to be inoperative may be discarded.

With respect to the class I wafers, the next step is to cut out all inoperative functions. The cut is made inside of the outer I/O and power pads (12, 13, 14 and 15 or 12R, 13R, 14R and 15R in FIG. 2) so that the outer set of pads will remain on the wafer after the inoperative function has been removed. In one preferred embodiment of the invention wherein an inner set of I/O and power pads (16, 17, 18 and 19 and 16R, 17R, 18R and 19R in FIG. 2) are provided, this cut will be made outside the inner pads so that the inner pads are removed from the wafer along with the inoperative function. The reason this method is preferred is that the power pads which remain on the inoperative functional island that was removed will greatly facilitate further testing and analysis of the inoperative functional island. After appropriate tests have been completed, the inoperative islands that were removed from class I wafers may be discarded.

With respect to class II wafers, the next step is to cut out the inoperative islands. This cut is made outside of the outer set of I/O and power pads so that the outer set of pads is removed from the wafer along with the inoperative island. After the inoperative islands have been removed, the remainder of the class II wafer, after any desired testing and analysis, may be discarded.

When islands are cut out from wafers, any appropriate means (such as, for example, a laser) may be used.

Referring again to FIG. 2, assume that island 3 is an inoperative island on a class I (mostly good) wafer. As was described above, island 3 will be cut out along broken line 20 inside of the outer set of I/O and power pads 12, 13, 14 and 15, and outside of the inner set of pads 16, 17, 18 and 19. Assume further that island 3R is an operative island from a class II (mostly bad) wafer. This island will be cut out along broken line 21 outside of the outer set of I/O and power pads 12R, 13R, 14R and 15R. Island 3 will be discarded; island 3R will be saved.

Throughout the steps of manufacturing wafers in accordance with designs A and B and sorting wafers into class I and class II, it is desirable to keep close track of the various kinds of wafers. For example, within each class, wafers of designs A and B should be kept separate from each other. Also, within class I, wafers of designs A and B should be broken down into further groups in accordance with the particular islands which were found to be inoperative. Within class II, an inventory should be separately kept for each type of operative island which is removed.

After the steps described above have been completed, IIA islands (that is, operative islands removed from class II wafers that were manufactured in accordance with design A) may be used to "repair" IB wafers (class I wafers that were manufactured in accordance with design B); and IIB islands (operative islands that were removed from class II wafers that had been manufactured in accordance with design B) may be used to "repair" IA wafers (class I wafers that were manufactured in accordance with design A). This is accomplished as follows:

1. from the class I wafers, select a wafer from which an inoperative functional island has been removed;
2. from the inventory of class II islands, select the mirror image of the island that was removed from the class I wafer (a IIA island will be selected if a IB wafer was selected, and a IIB island will be selected if a IA wafer was selected);
3. invert the island (turn it upside down) over the wafer and bring the I/O and power pads that are on the island into contact with the complementary mirror image I/O and power pads that are on the wafer;
4. electrically connect (by spot or gang soldering, or other appropriate method) the power pads on the class II island to the power pads on the class I wafer.

Referring again to FIG. 2, operative island 3R (after removal from a class II wafer) is used to repair a class I from which an island 3 has been removed by connecting I/O and power pads 12R to pads 12, pads 13R to pads 13, pads 14R to pads 14 and pads 15R to pads 15.

Figure 3:
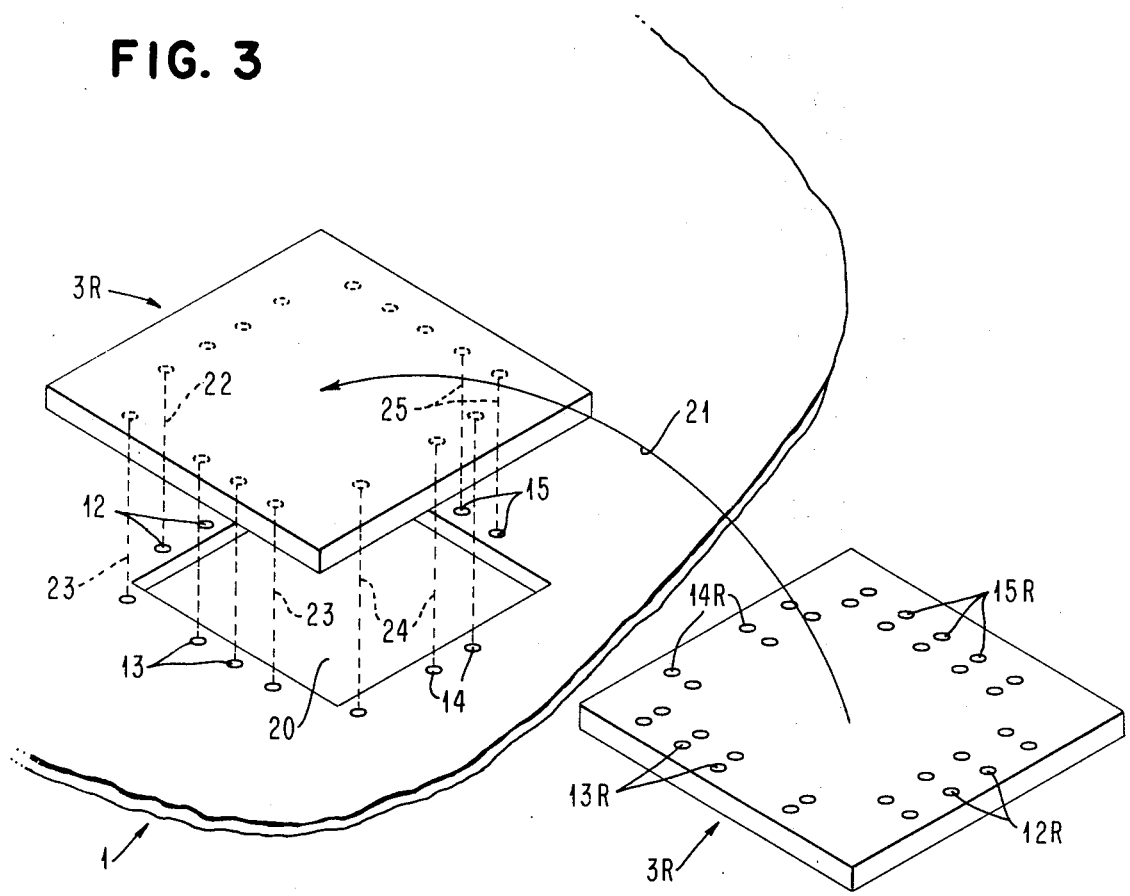
FIG. 3 illustrates the manner in which a functional island removed from one wafer is used to repair a second wafer.

FIG. 3 shows a wafer 1 (assume it was manufactured in accordance with design A) from which an inoperative island 3 (see FIG. 1) has been removed leaving a hole 20 surrounded by I/O and power pads 12, 13, 14 and 15 (only two of the four pads 12 is shown and only two of the five pads 15 are shown). Also shown in FIG. 3 is an island 3R which has been removed from a class II wafer that was manufactured in accordance with design B. Island 3R is shown twice in FIG. 3 in order to illustrate the manner in which it will be inverted over wafer 1 as part of the process of repairing the wafer.

On the right-hand side of FIG. 3, island 3R is shown with its I/O and power pads 12R, 13R, 14R and 15R on the upper surface thereof in a manner similar to that depicted in FIG. 2. To replace the island 3 that was removed from wafer 1 (leaving hole 20) island 3R is inverted and placed above wafer 1 as indicated by the arrow 21. As is shown on the left-hand side of FIG. 3, island 3R will then be upside down over the hole 20 in wafer 1 with its outer I/O and power pads (indicated by broken circles) on its lower surface. I/O and power pads 12R will be brought into alignment with pads 12 as indicated by broken line 22, pads 13R will be brought into alignment with pads 13 as indicated by broken lines 23, pads 14R will be brought into alignment with pads 14 as indicated by broken lines 24 and pads 15R will be brought into alignment with pads 15 as indicated by broken lines 25. The aligned pads will then be brought into contact and electrically connected so that wafer 1 will become functionally identical to a wafer on which island 3 was operative.

Figure 4:
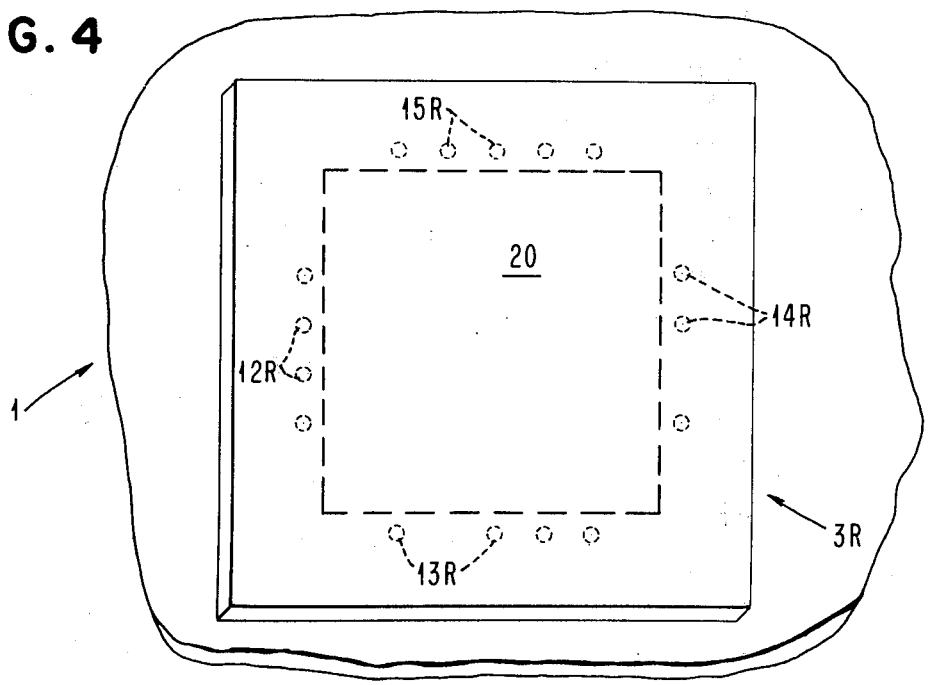
FIG. 4 illustrates the appearance of a wafer after a functional island from another wafer has been attached thereto.

FIG. 4 shows how the wafer will appear after the above steps have been completed. In FIG. 4, for the sake of clarity, none of the other islands are shown. Atop wafer 1, and upside down, is island 3R which covers the hole 20. On the underside of island 3R are I/O and power pads 12R, 13R, 14R and 15R each of which is electrically connected to corresponding pads 12, 13, 14 and 15 (not shown in FIG. 4) which remained on wafer 1 when the inoperative island was removed.

Figure 5:
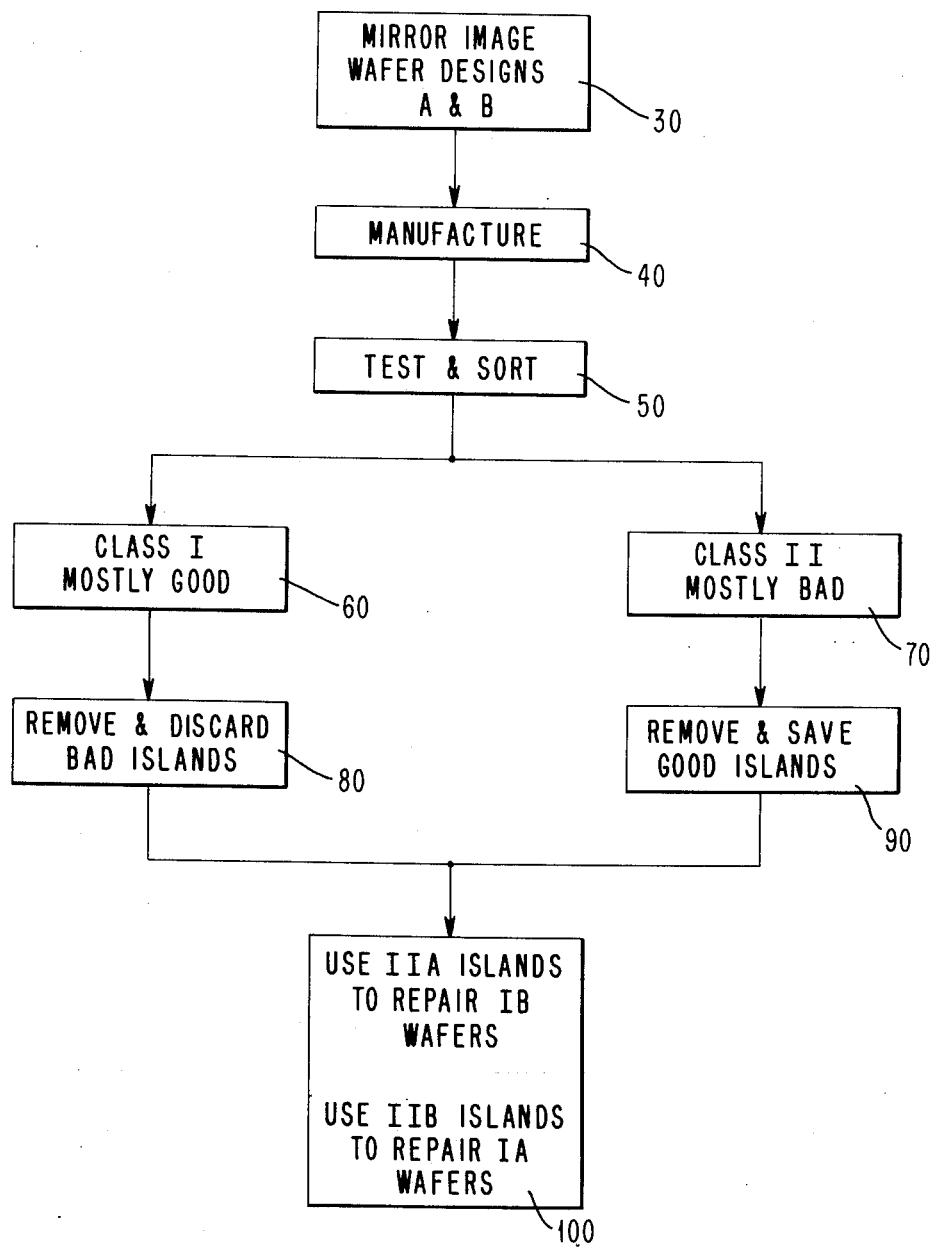
FIG. 5 is a flow diagram illustrating various steps in the manufacturing process.

Various steps in the manufacturing process are summarized in FIG. 5. First a wafer design A and its mirror image B are made (block 30) and wafers are manufactured (block 40) in accordance with both designs. The wafers are then tested and sorted (block 50) into wafers of a first class comprising wafers having a relatively small number of inoperative islands (block 60) and a second class comprising wafers having a relatively large number of inoperative islands (block 70). From the class I wafers, inoperative islands are removed and discarded (block 80). From the class II wafers, operative islands are removed and saved (block 90). Islands removed from class II wafers are then attached to class I wafers in the manner described above to replace inoperative islands that had been removed therefrom (block 100).

Modifications to the Invention

The preceding description indicated that inoperative islands are physically removed (by for example, cutting them out with a laser) from class I wafers. However, physical removal of the inoperative islands may not be necessary if the inoperative islands are, in some other manner, totally disconnected electrically from the remainder of the wafer. For example, referring to inoperative island 3 shown in FIG. 2, electrical removal of the inoperative island could be accomplished by breaking (with a laser or other appropriate means) the printed circuit lines which go from the island to I/O and power pads 12, 13, 14 and 15 (that is, the lines which are intersected by broken line 20 in FIG. 2). It would then also be necessary to take the further step of isolating all of the components contained within island 3 from the island 3R which will be used to "repair" the wafer. This further step may consist of any of a variety of techniques including, for example, depositing a dielectric material over the island. However, care must be taken to ensure that electrical contact will be made between pads 12 and 12R, 13 and 13R, 14 and 14R, and 15 and 15R. This alternative approach might be desirable in situations where physical removal of defective islands causes problems with respect to structural integrity of the wafer.

The above description also stated that wafers containing mostly operative islands are placed in class I and wafers containing mostly inoperative islands are placed in class II. Those skilled in the art will, of course, recognize that the division of wafers into classes I and II should, to some extent, depend upon production yields. For example, if a very small percentage of manufactured wafers contain mostly good functions, it might be desirable to assign to class I all wafers for which some lower percentage (say, for example, 30%) of islands are functional. When yields are low, a lowering of the requirements for class I wafers can produce a more economical use of available resources. On the other hand, if production yields are high, it could be more economical to limit the class I wafers to wafers for which a relatively high percentage (say, for example, 80%) of the islands are operative.

As was mentioned above, it may not always be absolutely essential that every detail of the islands on wafers made from designs A and B be mirror images of each other. It is only essential that the arrangement of I/O and power pads be complementary (mirror images) between designs A and B so that design A islands may be used to repair design B wafers, and vice versa. This realization becomes particularly important if one is to use the desired method to incorporate engineering changes into wafers that have already been manufactured. If it is desired to change the details of any particular island on a wafer, the obsolete islands can be removed as was described above and a new island having a complementary set of I/O and power pads can be attached to the wafer to replace it. In this case, the new islands would be manufactured in two mirror images designs (assuming that the wafers to be altered existed in both forms A and B) in any appropriate manner and would then be grafted onto the wafers that are to be changed.

Yet another application for this invention would arise in a situation where one particular island on the wafers is found to be inoperative much more frequently than the others. In this case, it might be desirable to separately manufacture relatively large quantities of these particular islands instead of relying solely upon operative islands from class II wafers for the supply of replacements.

It will also be recognized by those skilled in the art that, although the above description refers to deletion and replacement of one functional island at a time, if a class I wafer were found to have two (or more) adjacent inoperative islands it might be preferable to remove (or otherwise delete) the two (or more) islands as a single unit and to replace them with a similar unit comprising a plurality of adjacent operative islands removed from a class II wafer (or otherwise produced as was discussed above). Of course, the replacement islands will already contain appropriate interconnections among themselves so that no problem will have been caused by removing the corresponding I/O and power pads from the class I wafer.

While the invention has been particularly shown and described with reference to a preferred embodiment thereof, it will be understood by those skilled in the art that the above and other changes in form and details may be made therein without departing from the spirit and scope of the invention.

What is claimed is:

1. A multi-function, multi-island, wafer, comprising:
   a first island which is electrically isolated from input-output connections to the other islands of said wafer; and
   a second island that, with respect to certain input-output connections, is the mirror image of said first island;
   said second island having said certain input-output connections electrically connected to corresponding input-output connections related to said first island;

said second island thereby replacing said first island on said wafer.

2. The multi-function, multi-island, wafer of claim 1 wherein:
said first is electrically isolated from said wafer by physical removal therefrom.

3. As an article of manufacture, materials for manufacturing a multi-function, multi-island, wafer, comprising:
wafers manufactured in accordance with a first design;
wafer islands manufactured in accordance with a second design;
said first and second designs being related in that each island of said second design is, with respect to input-output pads, the mirror image of an island of similar function of said first design;
a group of wafers, sorted from said manufactured wafers, each containing at least one island that is not satisfactory for use;
said one island being electrically isolated from the other islands of a wafer in said group while leaving its associated input-output pads connected to the other islands of the wafer;
said one island on said wafer being replaced by electrically connecting the input-output pads associated with an island of similar function, manufactured in accordance with said second design, to the input-output pads associated with said one island that was electrically isolated from said first wafer.

4. The article of manufacture of claim 3 wherein:
said one island is electrically isolated from said wafer by physical removal therefrom.

* * * * *